United States Patent
Wang et al.

(10) Patent No.: US 11,205,572 B2
(45) Date of Patent: Dec. 21, 2021

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Zhi Dong Wang, Shanghai (CN); Yi Ying Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 85 days.

(21) Appl. No.: 16/824,831

(22) Filed: Mar. 20, 2020

(65) Prior Publication Data

US 2020/0303189 A1  Sep. 24, 2020

(30) Foreign Application Priority Data

Mar. 22, 2019  (CN) .......................... 201910223038.8

(51) Int. Cl.
*H01L 21/033* (2006.01)
*G03F 7/20* (2006.01)
*H01L 21/027* (2006.01)
*H01L 21/306* (2006.01)

(52) U.S. Cl.
CPC ........ *H01L 21/033* (2013.01); *G03F 7/70033* (2013.01); *H01L 21/0274* (2013.01); *H01L 21/30604* (2013.01)

(58) Field of Classification Search
None
See application file for complete search history.

(56) References Cited

U.S. PATENT DOCUMENTS

2020/0335355 A1* 10/2020 Jin ...................... H01L 21/0332
2020/0411366 A1* 12/2020 Shi ...................... H01L 21/0228

\* cited by examiner

*Primary Examiner* — Evren Seven
(74) *Attorney, Agent, or Firm* — Anova Law Group, PLLC

(57) ABSTRACT

Fabrication method of a semiconductor device is provided. The method includes forming an etch layer on the substrate, forming a first transitional layer and a first barrier layer on the etch layer, forming first islands on the first transitional layer by patterning the first barrier layer, forming first trenches in the first transitional layer to expose the etch layer, transferring the pattern of the first trenches into the etch layer and removing the first island, forming a second transitional layer and a second barrier layer on the etch layer and the first trenches, forming second islands on the second transitional layer by patterning the second barrier layer, forming second trenches in the second transitional layer to expose the etch layer, and transferring the pattern of the second trenches into the etch layer.

19 Claims, 16 Drawing Sheets

SEMICONDUCTOR DEVICE AND FABRICATION METHOD THEREOF

CROSS-REFERENCES TO RELATED APPLICATION

This application claims the priority of Chinese Patent Application No. 201910223038.8, filed on Mar. 22, 2019, the content of which is incorporated by reference in its entirety.

TECHNICAL FIELD

The present disclosure generally relates to the field of semiconductor technology and, more particularly, to a semiconductor device and a method of forming the semiconductor device.

BACKGROUND

Nanolithography is currently the most powerful and mature technology in integrated circuit fabrication. However, nanolithography has low precision, especially with the development of integrated circuit manufacturing technology, nanolithography is difficult to meet the increasing demands for high precision.

Extreme Ultraviolet Lithography is often referred to as EUV lithography. EUV lithography uses extreme ultraviolet light with a wavelength of 10-14 nm as the light source, which can reduce the exposure wavelength to 13.5 nm, thus extend the lithography to feature sizes below 32 nm. For example, the feature size can be 14 nm, 7 nm, or even 5 nm. Extreme ultraviolet lights are generated by exciting the K pole of ultraviolet tubes through electricity circulation. It has been proven that EUV lithography can offer high precision.

However, extensive research and development are still needed for EUV lithography to achieve a mature level that is suitable for mass production. The use of EUV lithography machines is expensive and hard to improve, resulting in difficulties in mass production. The cost of lithography using EUV lithography machines is very high.

Therefore, there is a need to provide a semiconductor device and fabrication method to provide high precision as EUV lithography provides and to satisfy the increasing demands of integrated circuit fabrication technology.

SUMMARY

One aspect of the present disclosure provides a method for forming a semiconductor device. The method includes forming an etch layer on a substrate, forming a first barrier layer on the etch layer, forming a first transitional layer on the first barrier layer, forming a plurality of first islands on the first transitional layer by patterning the first barrier layer, forming a plurality of first trenches in the first transitional layer to expose the etch layer, the plurality of first trenches extending in a first direction, wherein at least a portion of a first trench is located at each side of a corresponding first island along the first direction, transferring patterns of the plurality of first trenches into the etch layer and removing the first islands, leaving a disconnected portion in a corresponding first trench at a location of a removed first island, forming a second transitional layer and a second barrier layer on the etch layer and the plurality of first trenches, forming a plurality of second islands on the second transitional layer by patterning the second barrier layer, forming a plurality of second trenches in the second transitional layer to expose the etch layer, the plurality of second trenches extending in the first direction, wherein at least a portion of a second trench is located at each side of a corresponding second island along the first direction, and transferring patterns of the plurality of second trenches into the etch layer, wherein a second trench is disconnected at a location corresponding to a second island.

Another aspect of the present disclosure provides a semiconductor device formed by the disclosed method.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

In the semiconducting process, extreme ultraviolet (EUV) lithography is required to meet some high-precision requirements. However, the equipment of EUV lithography is not mature enough to be put into use, and the cost of EUV lithography is very high.

The present disclosure provides a method for forming a semiconductor device by using a substrate, forming an etch layer on the substrate, forming a first transitional layer on the etch layer, forming a plurality of first islands on the first transitional layer, forming first trenches in the first transitional layer by etching; removing the first transitional layer and the first islands after transferring the pattern of the first trenches to the etch layer; forming a second transitional layer on the surface of etch layer after etching; forming a plurality of second islands on the second transitional layer; using the location of the second islands to form second trenches in the second transitional layer; and transferring the pattern on the second transitional layer to the etch layer, thus transferring the patterns of the first trenches and the second trenches together to the etch layer.

To better clarify the aforementioned objects, features, and advantages of the present disclosure, some embodiments combined with figures are given below to elaborate on the present disclosure.

Figure 29:
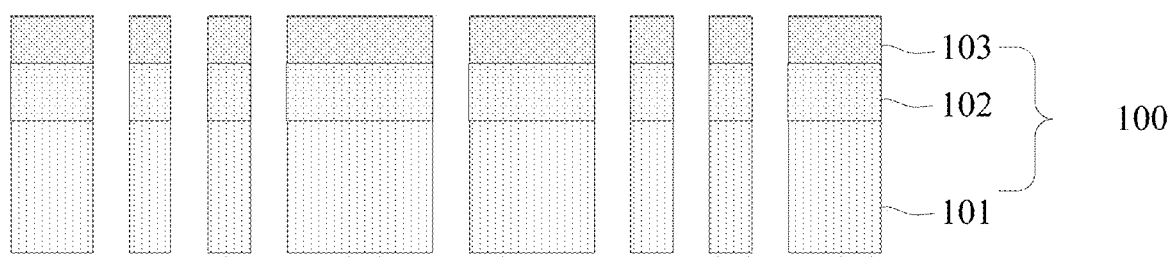
Figure 30:
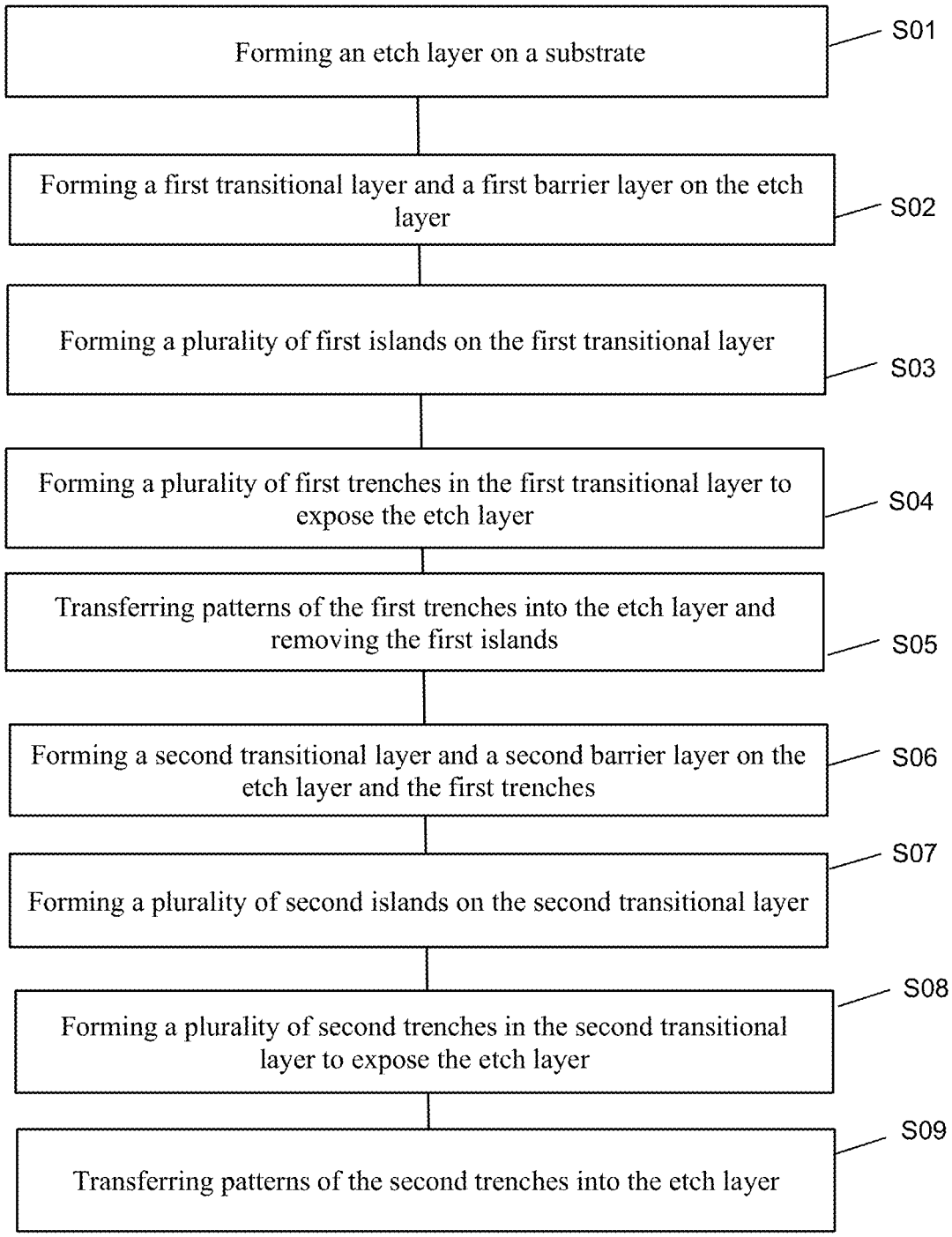
FIG. 30 illustrates an exemplary fabrication process of a semiconductor device consistent with various disclosed embodiments of the present disclosure.

FIG. 30 illustrates a flowchart of an exemplary method for fabricating a semiconductor device consistent with various disclosed embodiments in the present disclosure. FIGS. 1-29 illustrate schematic views of forming a semiconductor device at certain stages of an exemplary fabrication process.

FIG. 1 to FIG. 8 illustrate an exemplary method for forming first islands according to various embodiments of the present disclosure.

Figure 1:
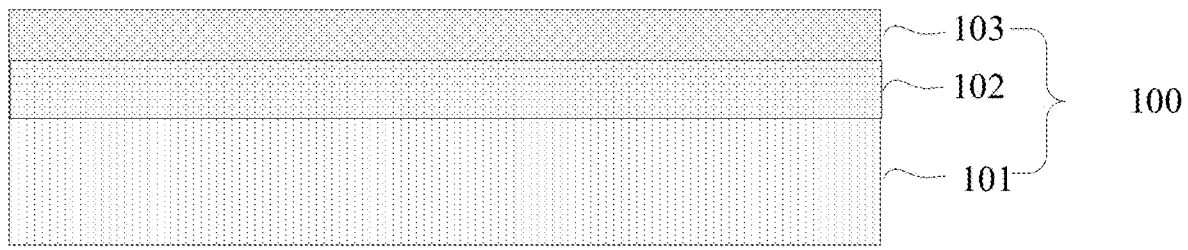
FIGS. 1-29 illustrate structures corresponding to certain stages during an exemplary fabrication process of a semiconductor device consistent with various disclosed embodiments of the present disclosure.

Referring to FIG. 30, at the beginning of the fabrication process, a substrate is provided and an etch layer is formed on the substrate (S01). FIG. 1 shows a schematic cross-section view of a corresponding semiconductor structure.

Referring to FIG. 1, a substrate (not shown) is provided and an etch layer 100 is formed on the substrate. In one embodiment, the substrate has a device structure, and the device structure includes a gate, a source, a drain, and an isolation structure; a contact plug is to be formed on the device structure.

The etch layer 100 includes at least three layers, including a dielectric layer 101 on the substrate, a protective layer 102 on the top of the dielectric layer 101, and an etch-surface layer 103 on the top of the protective layer 102.

The dielectric layer 101 is an oxide. In one embodiment, the dielectric layer 101 is silicon oxide.

The protective layer 102 is interposed between the dielectric layer and the etch-surface layer 103. On the one hand, the protective layer 102 facilitates close contact between the dielectric layer 101 and the etch-surface layer 103; on the other hand, the protective layer 102 serves to protect the dielectric layer 101 and the substrate at the bottom of the dielectric layer 101 from being mistakenly etched before forming a through plug hole.

The protective layer 102 can be a single layer or a plurality of layers. When the protective layer 102 is single-layer, the etch layer 100 has a three-layer structure; when the protective layer 102 is multiple-layer, the etch layer 100 has a structure of more than three layers.

In one embodiment, the protective layer 102 is silicon nitride; in other embodiments, the protective layer 102 may be boron nitride or titanium nitride, or a single layer or a combination of any number of layers of silicon nitride, boron nitride, and titanium nitride.

In one embodiment, the etch-surface layer 103 is made of titanium nitride, and the etch-surface layer 103 is an initial open layer, that is, the pattern formed in early stage is first transferred onto the etch-surface layer 103. Further, the etch-surface layer 103 and the protective layer 102 have a high selectivity. Therefore, when the etch-surface layer 103 is etched, the protective layer 102 will not be etched, so that the dielectric layer 101 at the bottom of the protective layer 102 is protected.

Figure 2:
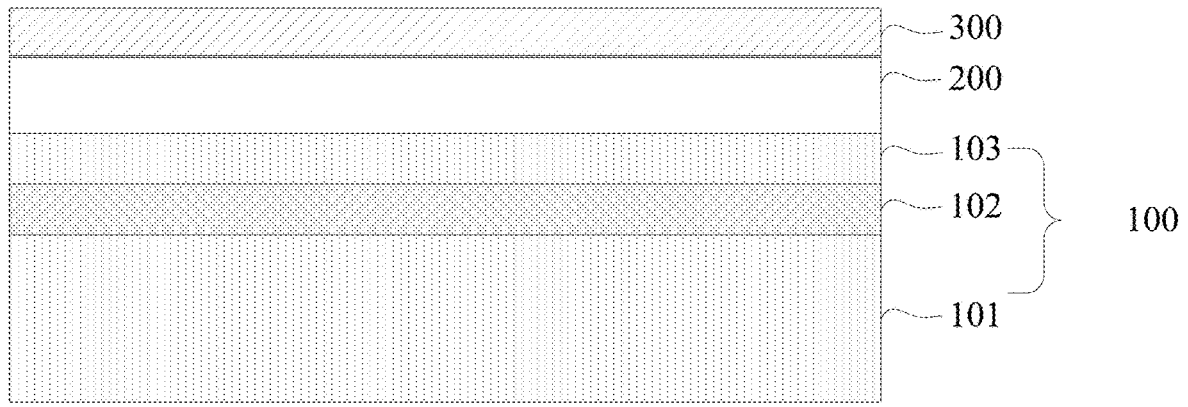

Returning to FIG. 30, a first transitional layer and a first barrier layer are formed on the etch layer (S02). FIG. 2 shows a schematic cross-section view of a corresponding semiconductor structure.

Referring to FIG. 2, a first transitional layer 200 and a first barrier layer 300 are formed on the etch layer 100. Specifically, the first transitional layer 200 is formed on the etch-surface layer 103, and the first barrier layer 300 is formed on the first transitional layer 200.

In one embodiment, the first transitional layer 200 is formed using chemical vapor deposition, and the material of the first transitional layer 200 has a high selectivity toward the material of the etch-surface layer 103. When the first transitional layer 200 is etched, the etch-surface layer 103 at the bottom of the first transitional layer 200 will not be etched. The material of the first transitional layer 200 is an oxide. In one embodiment, the material of the first transitional layer 200 is silicon oxide.

The first barrier layer 300 is on the top of the first transitional layer 200, and the material of the first barrier layer 300 has a high selectivity toward the material of the first transitional layer 200.

In one embodiment, the material of the first barrier layer 300 is amorphous silicon.

Returning to FIG. 30, a plurality of first islands are formed on the first transitional layer (S03). FIG. 3-8 are schematic illustrations showing steps of forming first islands in the embodiment of the present disclosure.

Figure 3:
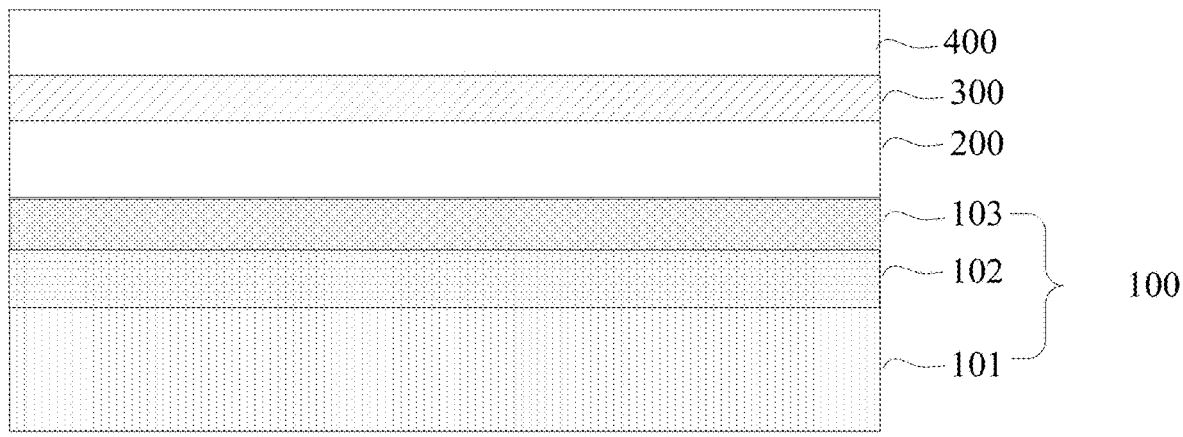

Referring to FIG. 3, a first sacrificial layer 400 is formed on the top of the first barrier layer 300. The purpose of forming the first sacrificial layer 400 is to pattern the first barrier layer 300, and the first barrier layer 300 is used to form a plurality of first islands on the first transitional layer 200.

In one embodiment, the material of the first sacrificial layer 400 is different from the material of the first barrier layer 300, so that the process of removing the first sacrificial layer 400 by subsequent etching does not etch and damage the first barrier layer 300. The material of the first sacrificial layer 400 can be silicon oxide. The material of the first sacrificial layer 400 shall have a high etching selectivity toward the material of the first hard mask 402 and the material of the first barrier layer 300.

In other embodiments, the material of the first sacrificial layer 400 may be silicon nitride, silicon carbide, silicon oxycarbonitride, or silicon oxynitride.

Figure 4:
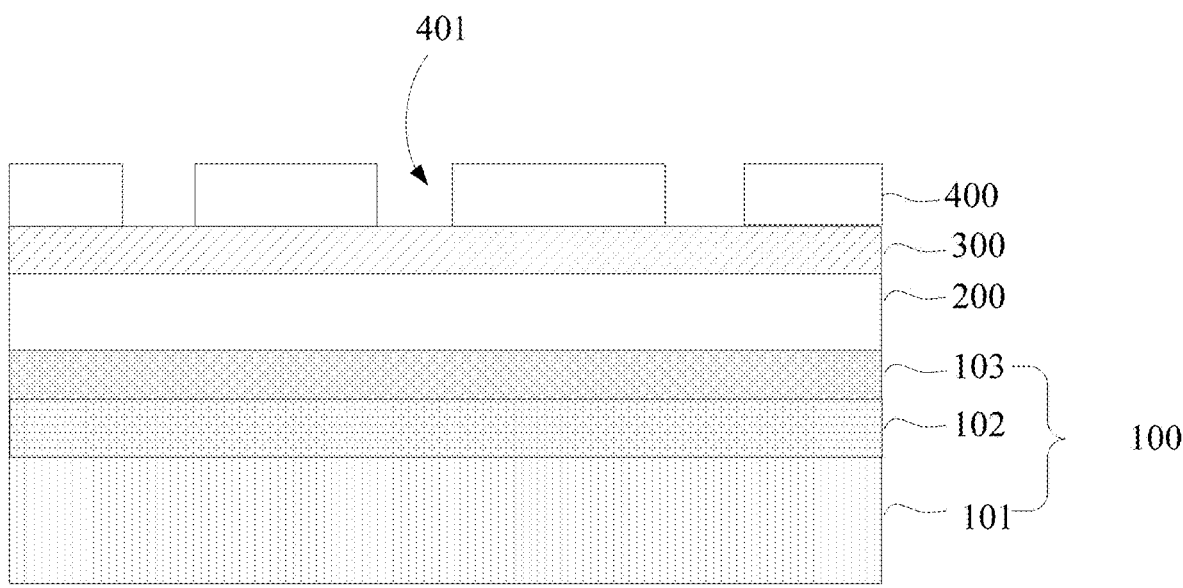

Referring to FIG. 4, a plurality of first grooves 401 are formed in the first sacrificial layer 400.

The detailed step includes forming a first patterned photoresist layer (not shown in the figure) on the first sacrificial layer 400 and etching the first sacrificial layer 400 by using the first patterned photoresist layer as a mask to form a plurality of first grooves 401.

In one embodiment, the method of etching the first sacrificial layer 400 is dry etching, and the gas includes an etching gas and a carrier gas. The etching gas includes one or more of $CF_4$, $CHF_3$, $CH_2F_2$, and $CH_3F$. The carrier gas is hydrogen, nitrogen, or an inert gas. Specifically, the etching gas can be $CF_4$, the flow rate is 50 standard mL/min to 150 standard mL/min, the etching chamber temperature is 10 degrees Celsius to 60 degrees Celsius, the etching chamber pressure is 10 mTorr to 50 mTorr, and the etching time is 15 seconds to 50 seconds.

In one embodiment, the pattern of the first patterned photoresist is rectangular and distributed at desired positions.

Figure 5:
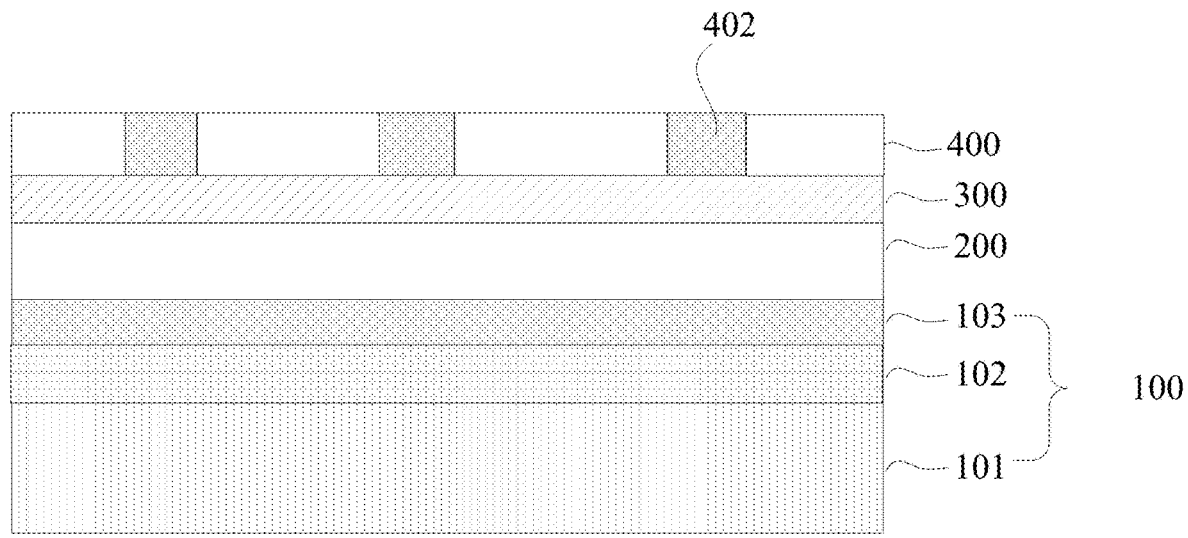

Referring to FIG. 5, the first grooves 401 are filled with a first hard mask material 402.

In one embodiment, the process of filling the first grooves 401 with the first hard mask material 402 is a chemical vapor deposition process or a physical vapor deposition process. After filling the first hard mask material 402, the first hard mask material 402 is planarized until the top surface of the first sacrificial layer 400 is exposed, only keeping the first hard mask material 402 in the first grooves 401.

In one embodiment, the planarization process is a chemical mechanical polishing process.

In one embodiment, the first hard mask material 402 can be silicon nitride, ensuring a high etching selectivity between the first hard mask material 402 and the first barrier layer 300 and the first sacrificial layer 400.

After filling the first hard grooves 401 with the first hard mask material 402, the method further includes removing the first sacrificial layer 400 and retaining the first hard mask material 402 inside the first grooves 401 (not shown in the figure).

In one embodiment, the process of removing the first sacrificial layer 400 is a wet removal process, and the first sacrificial layer 400 is removed by using a hydrofluoric acid solution.

In other embodiments, when the material of the first sacrificial layer 400 is silicon nitride, the first sacrificial layer 400 is removed by etching using a phosphoric acid solution.

Figure 6:
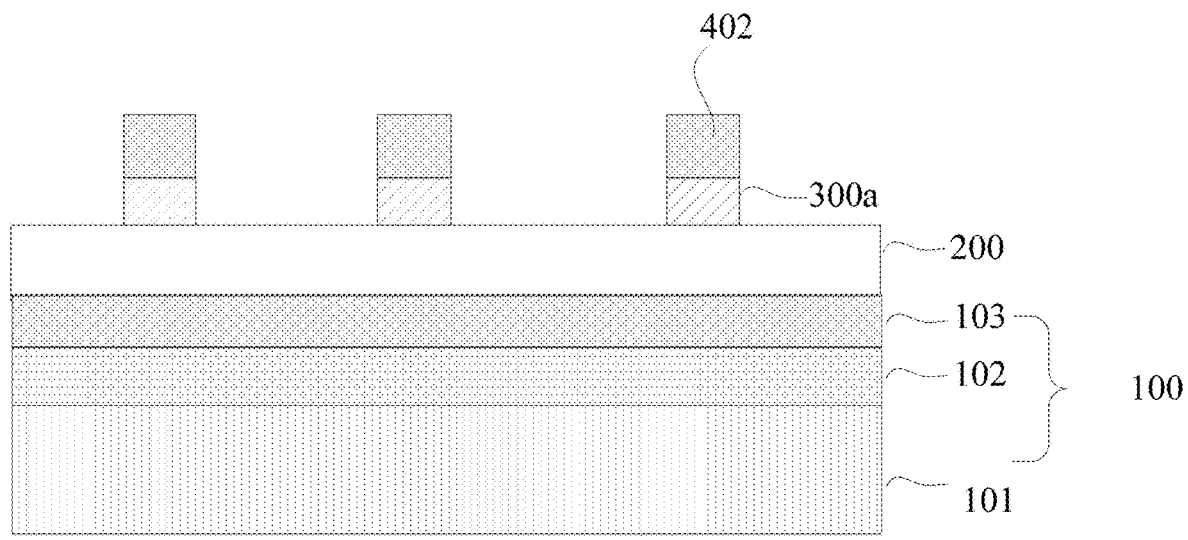

Referring to FIG. 6, the first barrier layer 300 is etched by using the first hard mask material 402 as a mask to form the first islands 300a.

Figure 7:
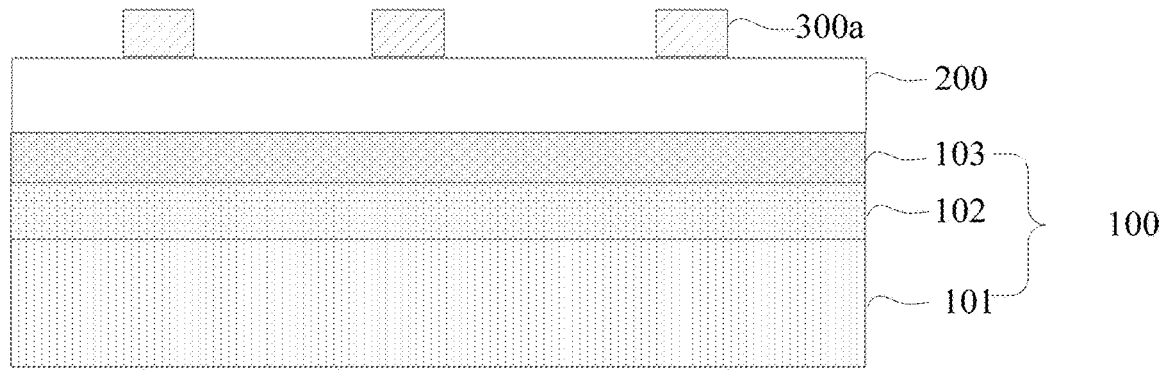

Referring to FIG. 7, the first hard mask material 402 is removed, and the first island 300a is retained on the first transitional layer 200.

Figure 8:
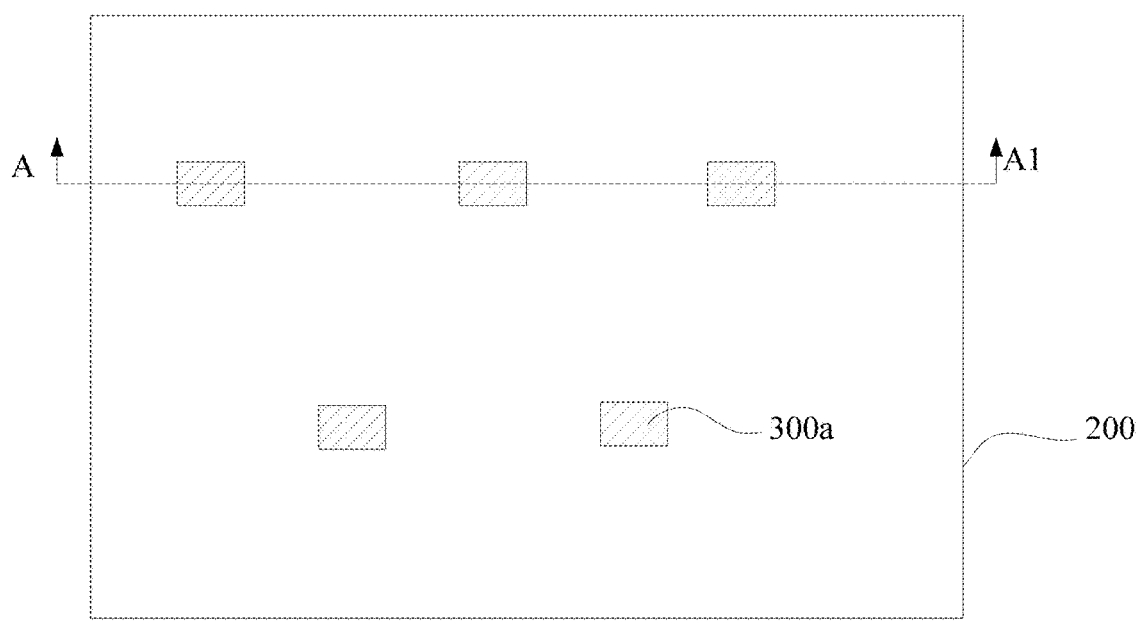

Referring to FIG. 8, FIG. 8 is a top view of FIG. 7, and FIG. 7 is a cross-sectional view of FIG. 8 in the direction of line AA1. It can be seen that the plurality of first islands 300a are distributed on the first transitional layer 200.

It should be noted that, in the process of forming the first islands 300a, an etching selectivity needs to be ensured between adjacent materials.

FIG. 9 to FIG. 14 are partial schematic illustrations showing steps of forming first trenches in the embodiment of the present disclosure.

Figure 9:
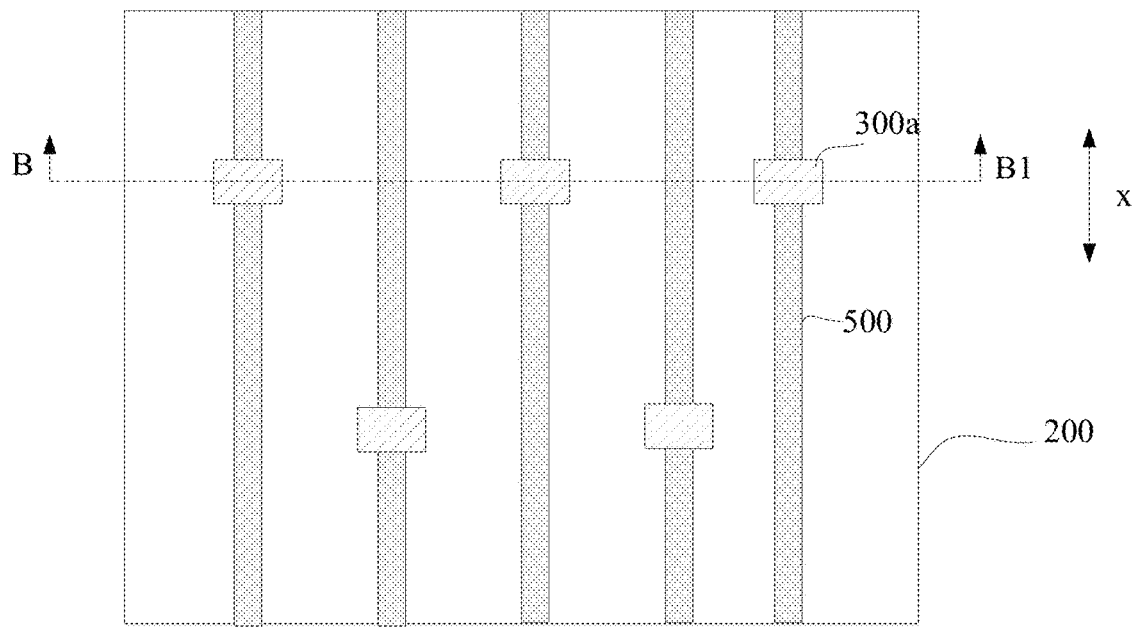
Figure 10:
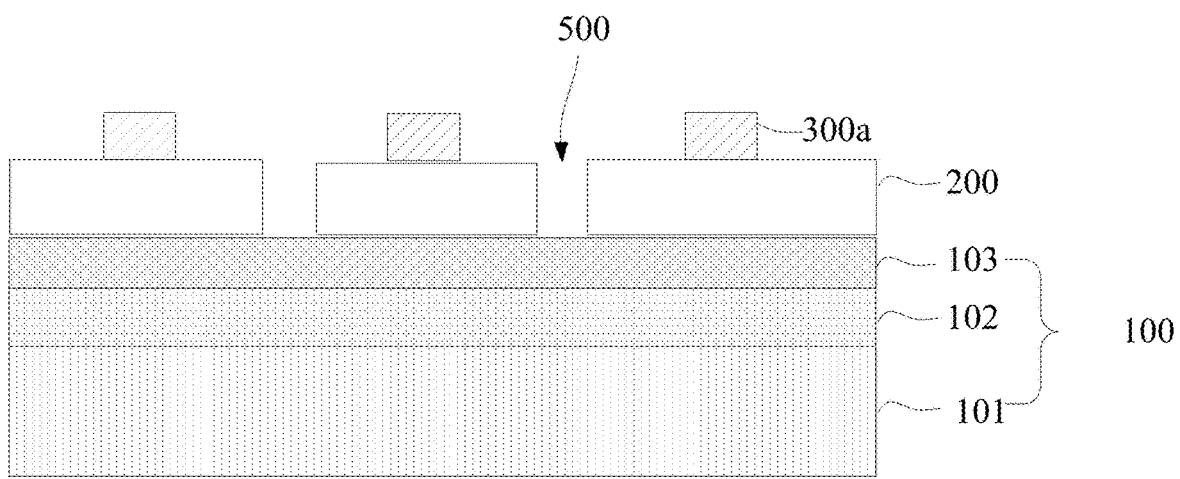

Returning to FIG. 30, a plurality of first trenches are formed in the first transitional layer to expose the etch layer (S04). FIG. 9 is a schematic illustration showing the formation of the first trenches on the first transitional layer; and FIG. 10 is a cross-sectional view of FIG. 9 in the direction of line B-B1.

In one embodiment, a second patterned photoresist layer (not shown) is formed on the first transitional layer 200. The second patterned photoresist layer and the first islands 300a are used as masks for etching the first transitional layer 200 to form a plurality of first trenches 500 in the first transitional layer 200. The bottom of the first trenches 500 exposes a portion of the surface of the etch-surface layer 103.

Referring to FIG. 9, a plurality of first trenches 500 extend in a first direction x. Since the first islands 300a are used as masks during etching, at least part of the first trenches 500 are located on both sides of the corresponding position of the first islands 300a. In a top view, the first trenches 500 are disconnected by the first islands 300a in the first direction x. Moreover, the opening width of the first trenches 500 perpendicular to the first direction x is smaller than the width of the first islands 300a.

Figure 11:
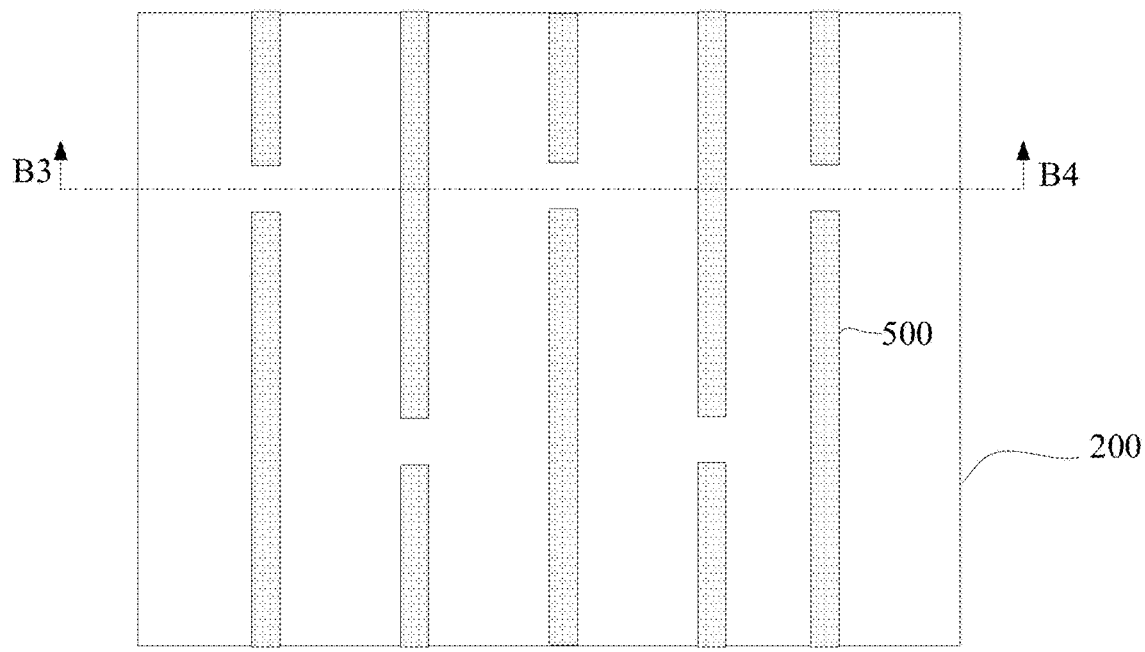

Returning to FIG. 30, patterns of the first trenches are transferred into the etch layer and the first islands are removed (S05). FIG. 11 is a schematic illustration showing partial steps of transferring the pattern of the first trenches 500 into the etch layer 100; and FIG. 12 is a cross-sectional view of FIG. 11 along the direction of line B3-B4.

Figure 12:
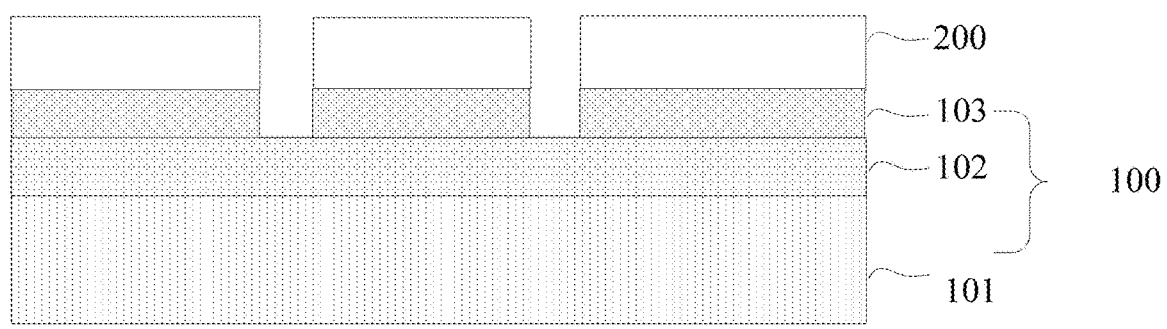

Referring to FIG. 11 and FIG. 12, the etch-surface layer 103 is etched based on the shape of the first trenches 500 to open the etch layer, and the first trenches 500 are formed in the etch-surface layer 103. The dielectric layer 102 is exposed at the bottom of the first trenches 500. The first island 300a is removed after the etching layer is opened.

In one embodiment, the material of the etch-surface layer 103 is titanium nitride, and the method of etching the etch-surface layer 103 is a dry etching process. The gas includes an etching gas and a carrier gas. The etching gas includes one or more of chlorine, nitrogen, or methane, and the carrier gas is hydrogen, nitrogen, or an inert gas. Specifically, the etching gas can be nitrogen gas, the gas flow rate is 0 standard mL/min to 100 standard mL/min, the etching chamber temperature is 10 degrees Celsius to 60 degrees Celsius, the etching chamber pressure is 10 mTorr to 150 mTorr, and the etch time is 5 seconds to 20 seconds.

In one embodiment, the process of removing the first islands 300a includes a wet removal, such as a wet etching.

In other embodiments, the first islands 300a can be removed first, then etching along the first trenches 500 to open the etch layer 100.

Figure 13:
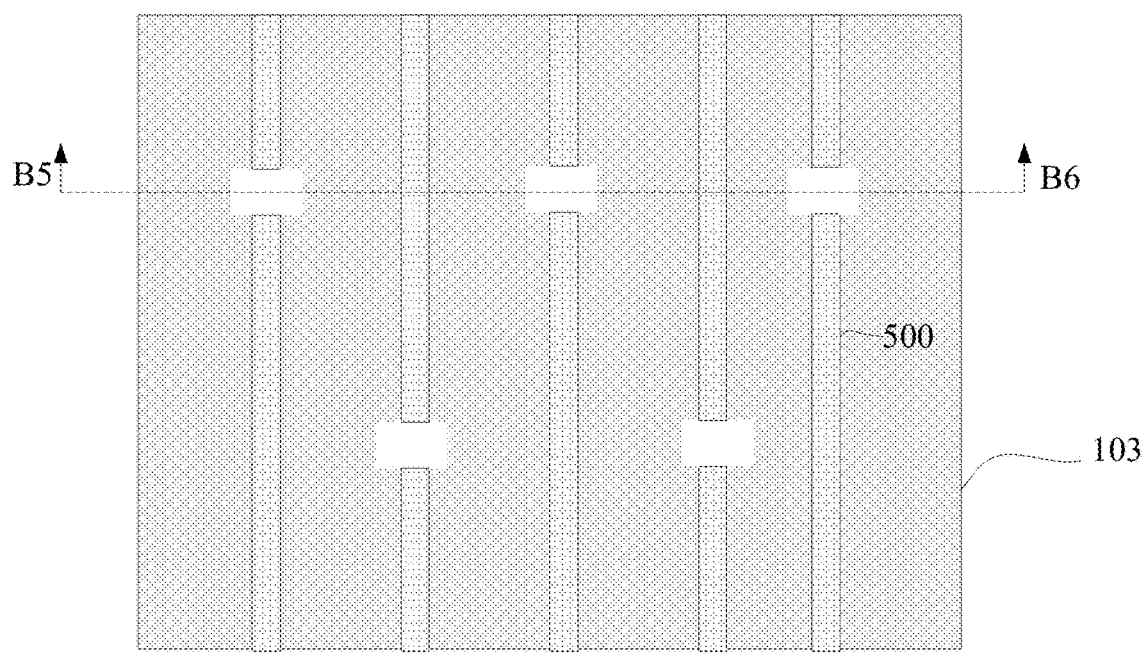
Figure 14:
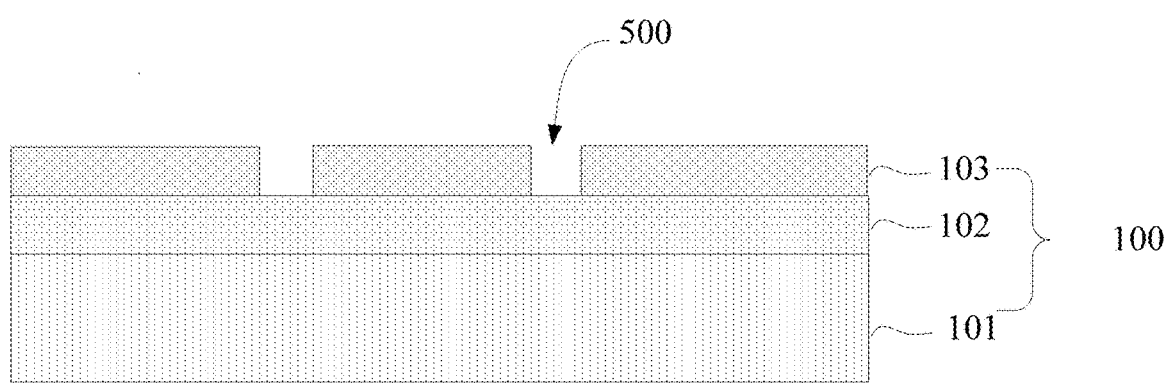

FIG. 13 is a schematic illustration showing the structure after the removal of the first transitional layer 200. FIG. 14 is a cross-sectional view of FIG. 13 along the direction of line B5-B6.

Referring to FIG. 13 and FIG. 14, the first transitional layer 200 is removed.

In one embodiment, the process of removing the first transitional layer 200 is wet etching. Since the material of the first transitional layer 200 is silicon oxide, it is removed by using a hydrofluoric acid solution.

It should be noted that the pattern of the first trenches 500 is transferred to the etch layer 100, and only the etch-surface layer 103 of the etch layer is opened, so that the etch layer 100 can be used for multiple times to form more complex patterns.

FIG. 15 to FIG. 27 are schematic illustrations showing the steps of forming second trenches in the embodiment of the present disclosure.

Returning to FIG. 30, a second transitional layer and a second barrier layer are formed on the etch layer and the first trenches (S06). FIG. 15 to FIG. 18 show the steps of forming the second transitional layer and the second barrier layer.

Figure 15:
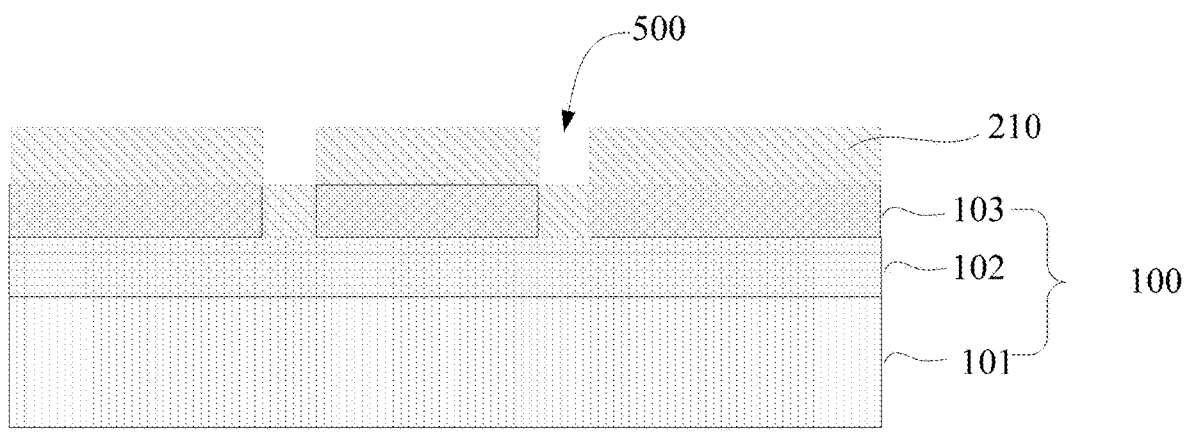

Referring to FIG. 15, a second transitional layer 210 is formed on the surface of the etch-surface layer 103, the bottom of the first trenches 500, and the sidewall of the first trenches 500.

In one embodiment, the process of forming the second transitional layer 210 is a chemical vapor deposition method. The material of the second transitional layer 210 has a high selectivity toward the material of the etch-surface layer 103. When the second transitional layer 210 is etched, the etch-surface layer 103 at the bottom of the second transitional layer 210 will not be etched. The material of the second transitional layer 210 is an oxide. In one embodiment, the material of the second transitional layer 210 is silicon oxide.

Figure 16:
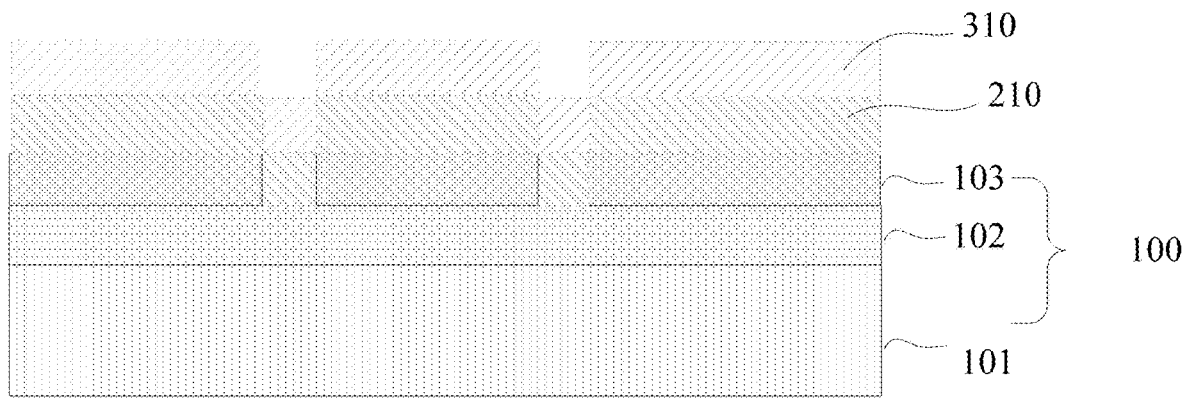

Referring to FIG. 16, a second barrier layer 310 is formed on the upper surface of the second transitional layer 210, and the material of the second barrier layer 310 has a high selectivity toward the material of the second transitional layer 210. The second barrier layers 310 are used to form second islands, as in the foregoing method of forming the first islands 300a.

Figure 17:
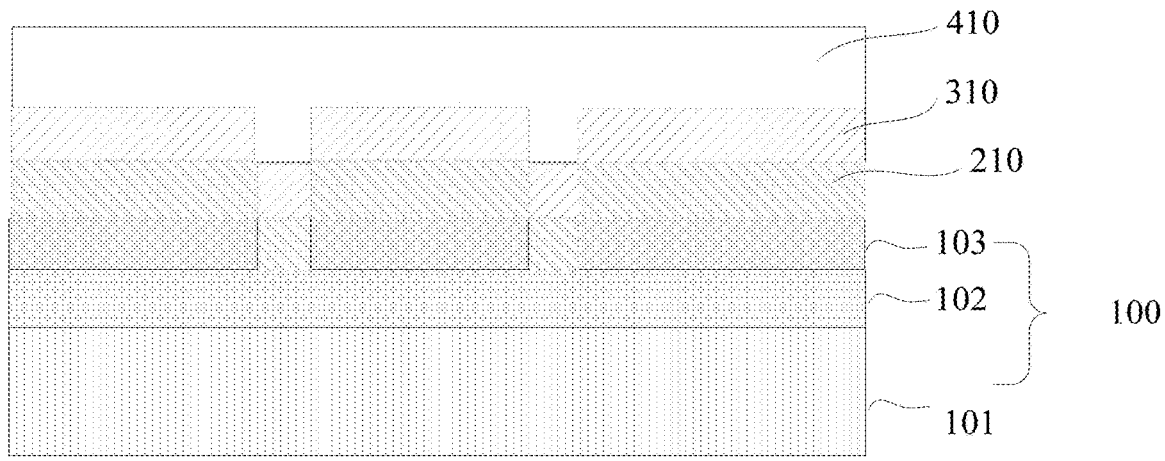
Figure 18:
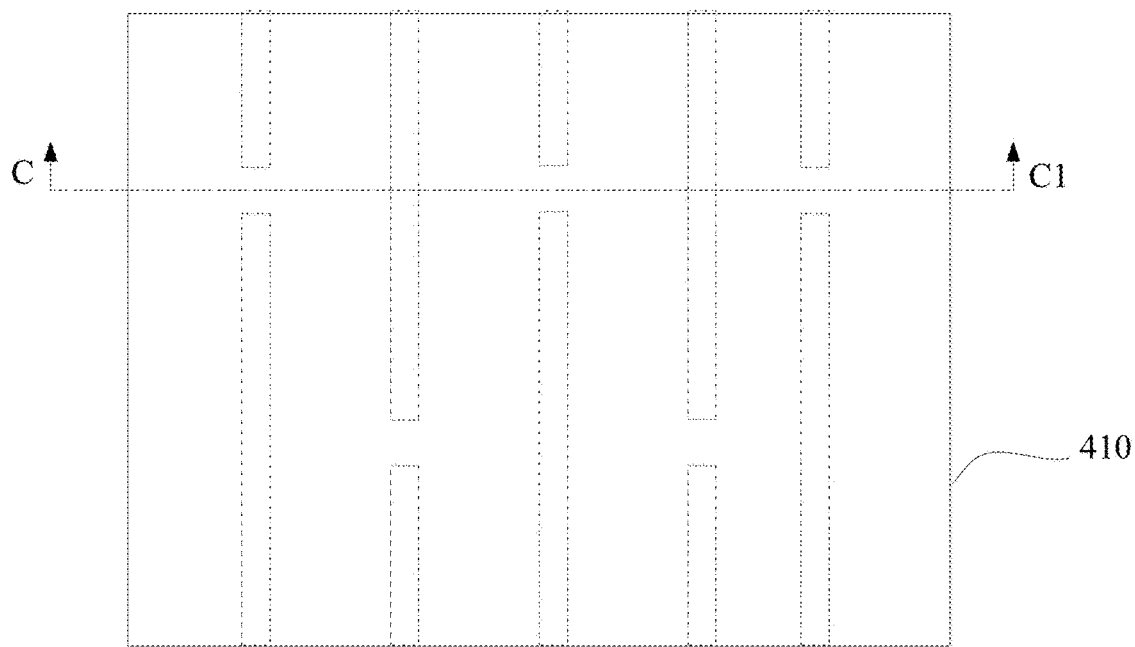

Referring to FIG. 17 and FIG. 18, FIG. 18 is a top view of FIG. 17, while FIG. 17 is a cross-sectional view of FIG. 18 along the direction of line CC1, wherein the dotted lines are the position of the first trenches 500 formed in previous steps. A second sacrificial layer 410 is formed on the second barrier layer 310, and the second sacrificial layer 410 is overlaid on the second barrier layer 310.

In one embodiment, the material of the second sacrificial layer 410 is different from the material of the second barrier layer 310, so that the process of removing the second sacrificial layer 410 by subsequent etching does not etch and damage the second barrier layer 310. The material of the second sacrificial layer 410 can be silicon oxide. The material of the second sacrificial layer 410 shall have a high etching selectivity toward the material of the second barrier layer 310.

In other embodiments, the material of the second sacrificial layer 410 can also be silicon nitride, silicon carbide, silicon oxycarbonitride, or silicon oxynitride.

Returning to FIG. 30, a plurality of second islands are formed on the second transitional layer (S07). FIG. 19 to FIG. 23 are schematic illustrations showing a process of forming second islands 310a.

First, a third patterned photoresist layer (not shown) is formed on the second sacrificial layer 410. In one embodiment, the pattern of the third patterned photoresist layer is rectangular and distributed at desired positions. The pattern of the third patterned photoresist layer is transferred to the second barrier layer 310 by using the third patterned photoresist layer as a mask to etch the second sacrificial layer 410, forming a plurality of second grooves. The second grooves are located between adjacent first trenches 500.

Figure 19:
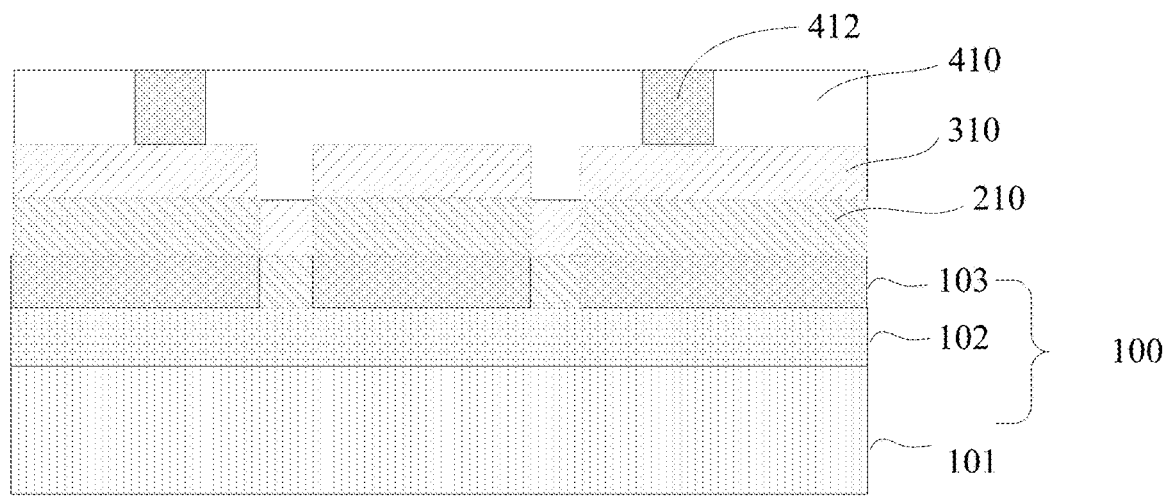
Figure 20:
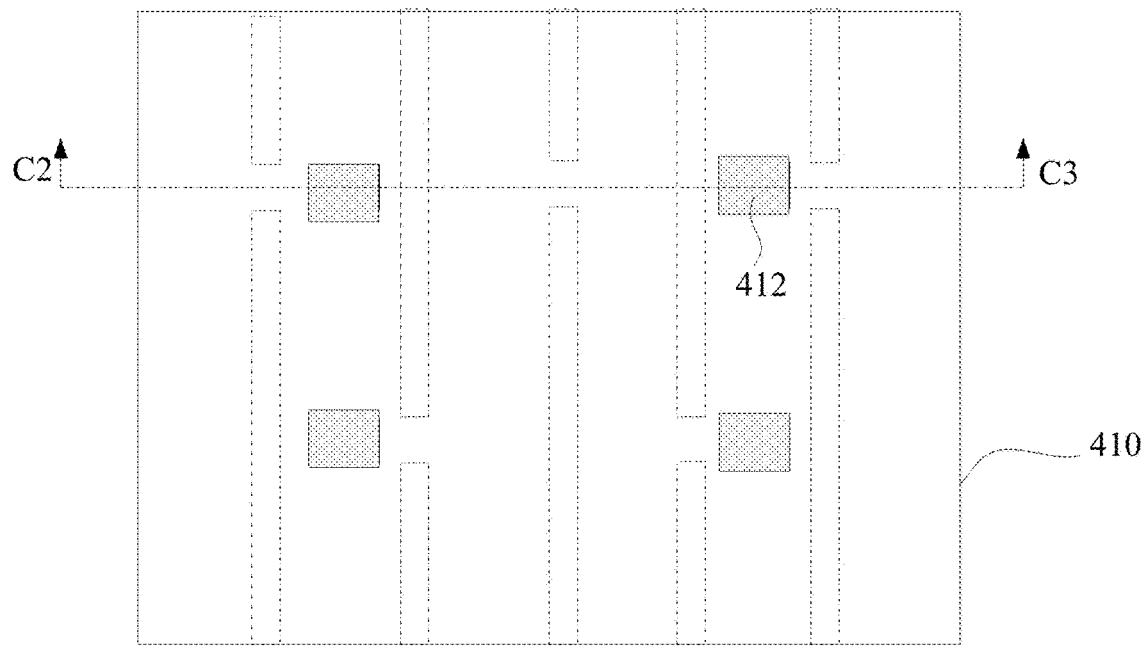

In one embodiment, the method of etching the second sacrificial layer 410 is dry etching, and the gas includes an etching gas and a carrier gas. The etching gas includes one or more of $CF_4$, $CHF_3$, $CH_2F_2$, and $CH_3F$. The carrier gas is hydrogen, nitrogen, or an inert gas. Specifically, the etching gas can be $CF_4$, the flow rate is 50 standard mL/min to 150 standard mL/min, the etching chamber temperature is 10 degrees Celsius to 60 degrees Celsius, the etching chamber pressure is 10 mTorr to 50 mTorr, and the etching time is 15 seconds to 50 seconds. Referring to FIG. 19, a second hard mask material 412 is formed in the second grooves.

In one embodiment, the process of forming the second hard mask material 412 in the second grooves is a chemical vapor deposition process or a physical vapor deposition process. After filling the second hard mask material 412, the second hard mask material 412 is planarized until the top surface of the second sacrificial layer 410 is exposed, only keeping the second hard mask material 412 in the second grooves.

In one embodiment, the planarization process is a chemical mechanical polishing process.

In one embodiment, the second hard mask material 412 can be silicon nitride, ensuring a high etching selectivity between the second hard mask material 412, the second barrier layer 310, and the second sacrificial layer 410.

Figure 21:
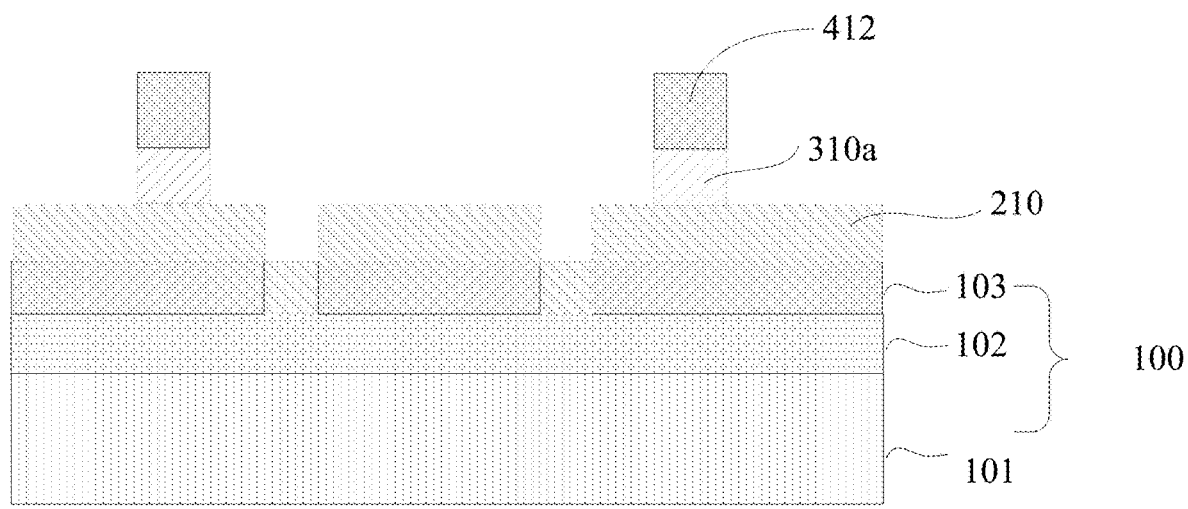

Referring to FIG. 21, the second barrier layer 310 is etched by using the second hard mask material 412 as a mask to form the second islands 310a.

Before the second barrier layer 310 is etched to form the second islands 310a, the method further involves removing the second sacrificial layer 410 and retaining the second hard mask material 412 in the second grooves.

In one embodiment, the process of removing the second sacrificial layer 410 is a wet removal process, and the second sacrificial layer 410 is removed by using a hydrofluoric acid solution.

In other embodiments, when the material of the second sacrificial layer 410 is silicon nitride, the second sacrificial layer 410 is removed by using a phosphoric acid solution.

Figure 22:
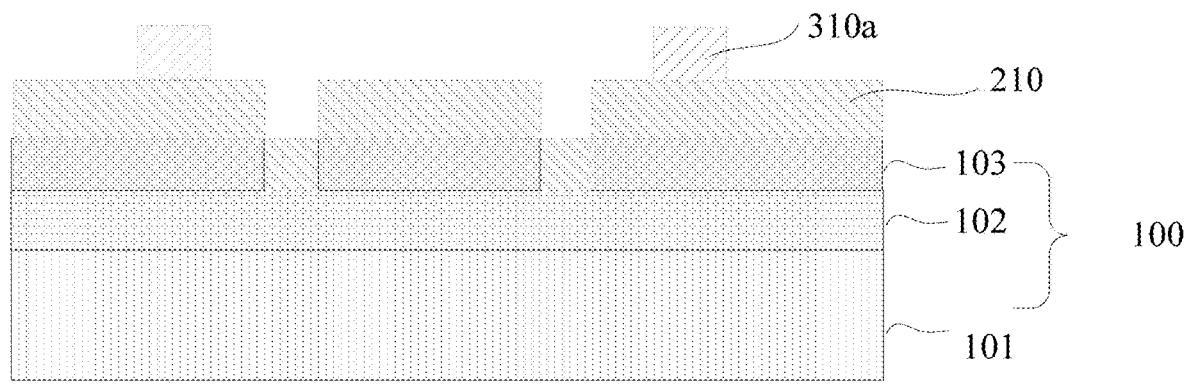
Figure 23:
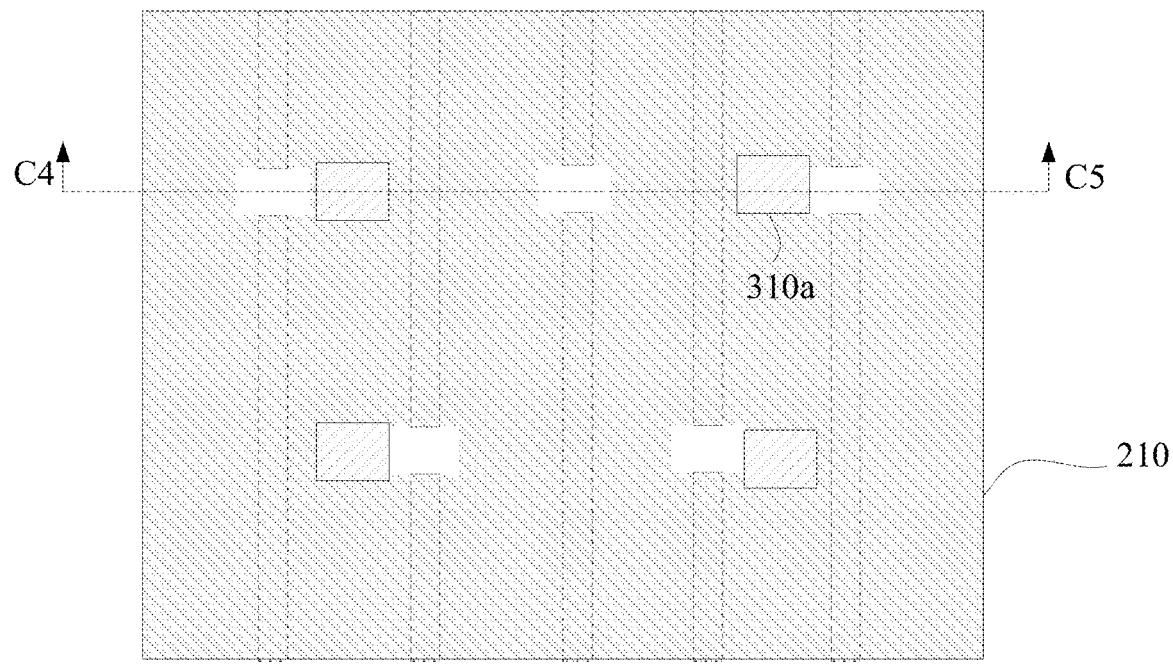

Referring to FIG. 22 and FIG. 23 (FIG. 22 is a cross-sectional view of FIG. 23 in the direction of the tangential line C4C5), the second hard mask material 412 is removed, while the second islands 310a are retained, and the second islands 310a are located on the top of the second transitional layer 210.

It should be noted that, in the process of forming the second islands 310a, an etching selectivity needs to be ensured between adjacent materials.

Returning to FIG. 30, a plurality of second trenches are formed in the second transitional layer to expose the etch layer (S08). FIG. 24 to FIG. 27 are schematic illustrations showing steps of forming second trenches in the embodiment of the present disclosure.

Figure 24:
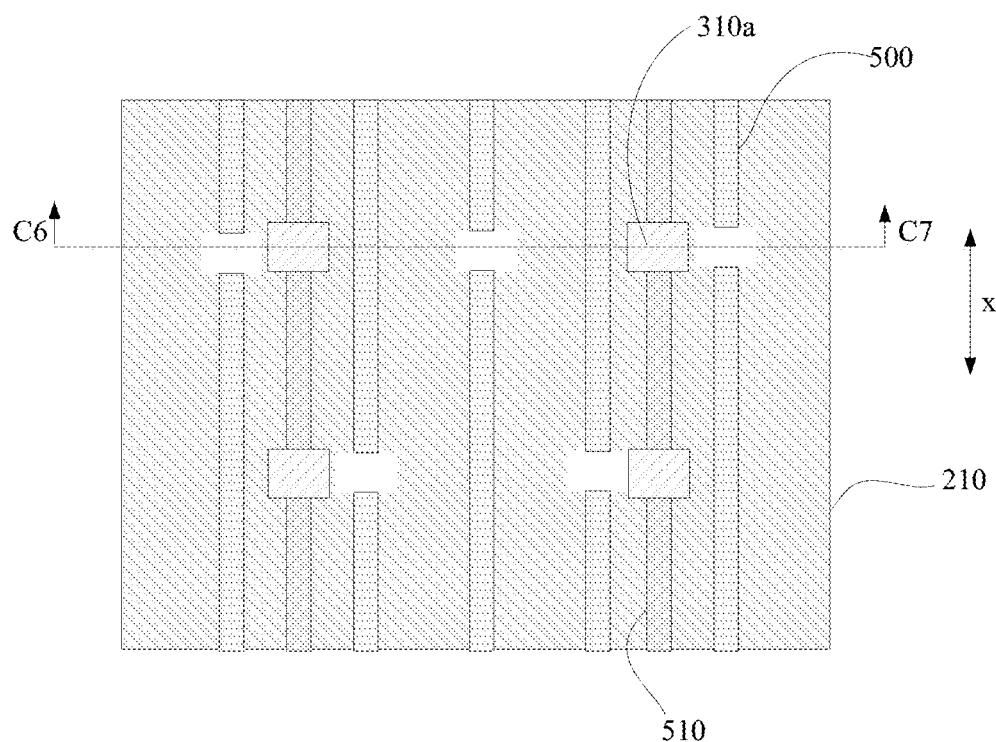
Figure 25:
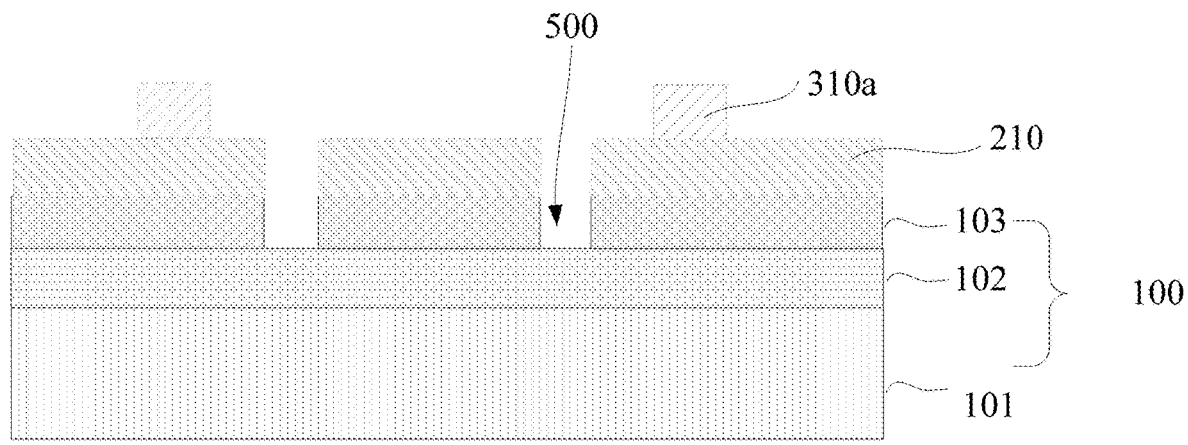

Among them, FIG. 24 is a schematic view showing the formation of the second trenches in the second transitional layer 210; and FIG. 25 is a cross-sectional view of FIG. 24 in the direction of line C6-C7.

Referring to FIG. 24, second trenches 510 are formed in the second transitional layer 210.

The specific steps involve forming a fourth patterned photoresist layer (not shown) on the second transitional layer 210, using superposed patterns of the fourth patterned photoresist layer and the second island 300a as masks for etching the second transitional layer 210 to form a plurality of second trenches 510 in the second transitional layer 210, and exposing a portion of the surface of the etch-surface layer 103 through the bottom of the first trenches 510.

The plurality of second trenches 510 extend in a first direction x. Since the second islands 310a are used as masks during etching, at least part of the second trenches 510 are located on both sides of the corresponding position of the second islands 310a. In a top view, the second trenches 510 are disconnected by the second islands 310a in the first direction x. Moreover, the opening width of the second trenches 510 perpendicular to the first direction x is smaller than the width of the second islands 310a.

Referring to FIG. 25, when the plurality of second trenches 510 are formed, the second transitional layer 210 covering the inner side wall and the bottom of the first trenches 500 is removed, so that the first trenches 500 are opened to expose the protective layer 102.

Figure 26:
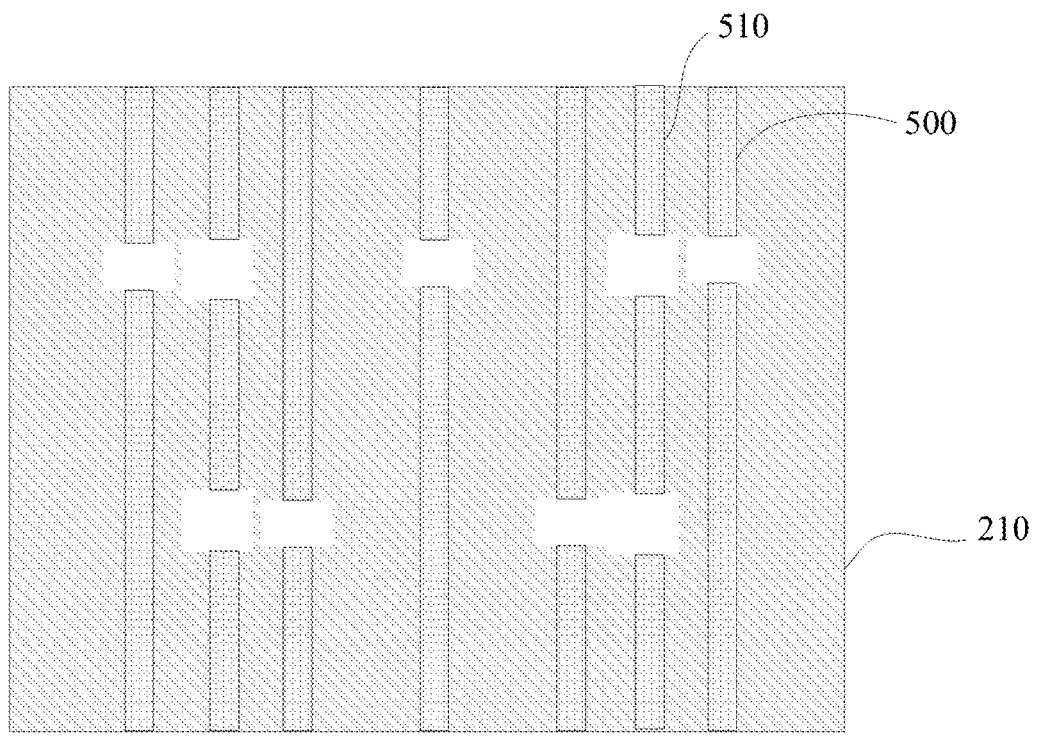

Referring to FIG. 26, etching continues along the shape of the second trenches 510 in the second transitional layer 210, opening the etch-surface layer 103, transferring the pattern of the second trenches 510 to the etch-surface layer 103, and removing the second islands 310a.

The material of the etch-surface layer 103 is titanium nitride. The method of etching the etch-surface layer 103 is a dry etching process, and the process of removing the second island 310a is wet removal.

In other embodiments, the second islands 310a can be removed first before etching along the second trenches 510 to open the etch layer 100.

Figure 27:
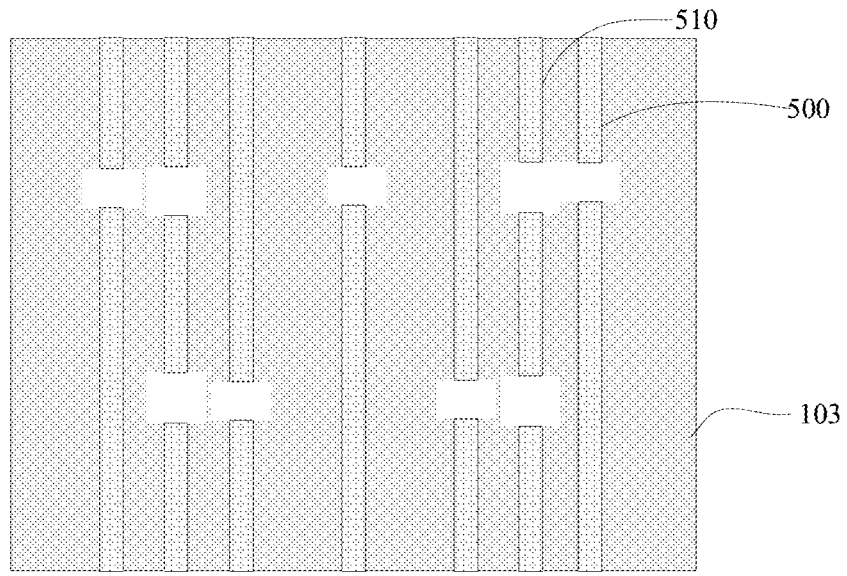

Referring to FIG. 27, the second transitional layer 210 is removed.

The shape of the pattern in the etch-surface layer 103 is retained, and the shape of the pattern is the combined shape of the first trenches 500 and the second trenches 510.

In one embodiment, the process of removing the second transitional layer 210 is wet etching. Since the material of the second transitional layer 210 is silicon oxide, it is removed by using a hydrofluoric acid solution.

Figure 28:
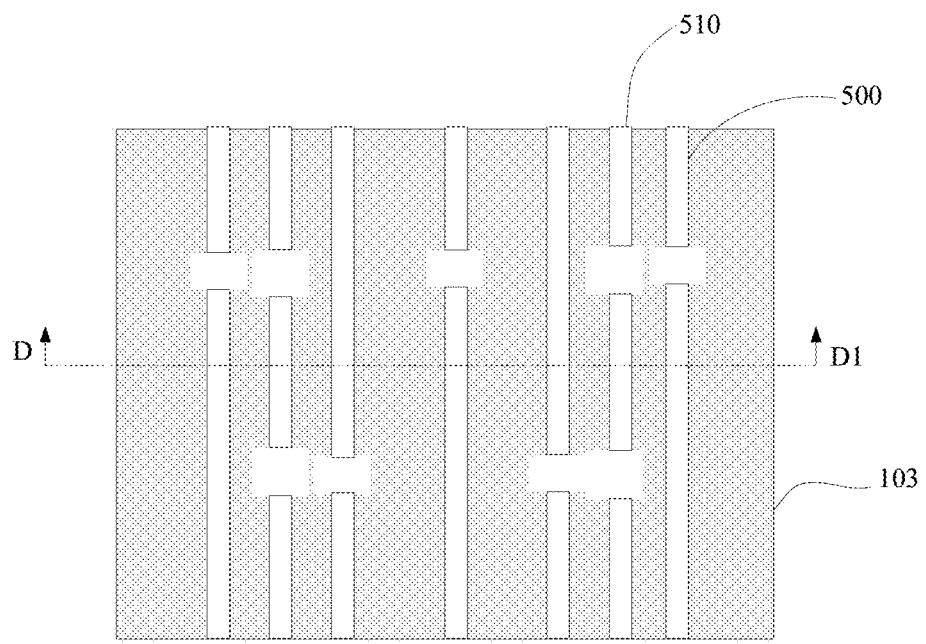

Returning to FIG. 30, patterns of the second trenches are transferred into the etch layer (S09). FIG. 28 is a top view illustrating the structure by etching through the protective layer 102 and the dielectric layer 101; and FIG. 29 is a cross-sectional view along line D-D1 of the structure illustrated in FIG. 28.

Referring to FIG. 28 and FIG. 29, etching is continued in the protective layer 102 and the dielectric layer 101 following the shape of the first trenches 500 and the second trenches 510 in the etch-surface layer 103 to completely etch through the etch layer 100.

In one embodiment, a dry etching is used to etch through the protective layer 102 and the dielectric layer 101, although any suitable etching methods may also be used in accordance with various embodiments. The gas includes an etching gas and a carrier gas. The etching gas includes one or more of $CF_4$, $CHF_3$, $CH_2F_2$, and $CH_3F$. The carrier gas is hydrogen, nitrogen, or an inert gas.

The present disclosure also provides a semiconductor structure formed by the disclosed method. The present disclosure provides a method for etching and forming a shape of a target pattern satisfying the high-precision requirements on the etch-surface layer 103, and using the currently mature nanolithography technology to completely etch through the etch layer 100 following the target pattern and achieving the high precision of semiconductor fabrication.

As disclosed, the technical solutions of the present disclosure have the following advantages: forming an etch layer on a substrate; forming a first transitional layer on the etch layer; forming a plurality of first islands on the first transitional layer; using the locations of the first islands on the first transitional layer to etch and form first trenches; after transferring the pattern of the first trenches to the etch layer, removing the first transitional layer and the first islands; etching the surface of the etch layer to form a second transitional layer; forming second islands on the second transitional layer; etching second trenches on the second transitional layer by using the locations of the second islands; transferring the pattern on the second transitional layer to the etch layer, such that the patterns of both the first trenches and the second trenches are transferred together onto the etch layer. After transferring the patterns of both the first trenches and the second trenches together onto the etch layer, the etch layer is completely opened there-through. As such, high-precision fabrication of semiconductor devices is achieved and use of EUV lithography is avoided.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a semiconductor device, comprising:
    forming an etch layer on a substrate;
    forming a first transitional layer on the etch layer;
    forming a first barrier layer on the first transitional layer;
    forming a plurality of first islands on the first transitional layer by patterning the first barrier layer;
    forming a plurality of first trenches in the first transitional layer to expose the etch layer, the plurality of first trenches extending in a first direction, wherein at least a portion of a first trench is located at each side of a corresponding first island along the first direction;
    transferring patterns of the plurality of first trenches into the etch layer and removing the first islands, leaving a disconnected portion in a corresponding first trench at a location of a removed first island;
    forming a second transitional layer and a second barrier layer on the etch layer and the plurality of first trenches;
    forming a plurality of second islands on the second transitional layer by patterning the second barrier layer;
    forming a plurality of second trenches in the second transitional layer to expose the etch layer, the plurality of second trenches extending in the first direction, wherein at least a portion of a second trench is located at each side of a corresponding second island along the first direction; and
    transferring patterns of the plurality of second trenches into the etch layer, wherein a second trench is disconnected at a location corresponding to a second island.

2. The method according to claim 1, wherein forming the plurality of first islands on the first transitional layer by patterning the first barrier layer includes:
    forming a first sacrificial layer on the first barrier layer;
    forming a first patterned photoresist layer on the first sacrificial layer; and
    transferring a pattern of the first patterned photoresist layer to the first barrier layer.

3. The method according to claim 2, wherein transferring the pattern of the first patterned photoresist layer to the first barrier layer includes:
    etching the first sacrificial layer to form a plurality of first grooves by using the first patterned photoresist layer as a mask;
    filling the first grooves with a first hard mask material;
    removing the first sacrificial layer and retaining the first hard mask material in the first grooves;
    etching the first barrier layer by using the first hard mask material as a mask to form the plurality of first islands; and
    removing the first hard mask material on the plurality of first islands.

4. The method according to claim 3, wherein removing the first sacrificial layer includes a wet removal process.

5. The method according to claim 3, wherein etching the first hard mask material includes dry etching.

6. The method according to claim 3, wherein the first hard mask material includes silicon nitride.

7. The method according to claim 1, wherein forming the plurality of first trenches in the first transitional layer includes:
    forming a second patterned photoresist layer on the first transitional layer;
    etching the first transitional layer using the second patterned photoresist layer and the plurality of first islands as a mask; and
    forming the plurality of first trenches.

8. The method according to claim 1, wherein after transferring the pattern of the first trenches into the etch layer, the method further includes removing the plurality of first islands and the first transitional layer.

9. The method according to claim 8, wherein removing the plurality of first islands and the first transitional layer includes wet etching.

10. The method according to claim 1, wherein forming the plurality of second islands on the second transitional layer by patterning the second barrier layer includes:
    forming a second sacrificial layer on the second barrier layer, filling the plurality of first trenches with the second sacrificial layer; and
    forming a third patterned photoresist layer on the second sacrificial layer and transferring a pattern of the third patterned photoresist layer to the second barrier layer.

11. The method according to claim 10, wherein transferring the pattern of the third patterned photoresist layer to the second barrier layer includes:
    using the third patterned photoresist layer as a mask to etch the second sacrificial layer and to form second grooves, and the second grooves are located between adjacent first trenches;
    filling the second grooves with a second hard mask material;
    removing the second sacrificial layer and retaining the second hard mask material in the second grooves;
    etching the second barrier layer by using the second hard mask material as a mask to form the plurality of second islands; and
    removing the second hard mask material on the plurality of second islands.

12. The method according to claim 11, wherein the second hard mask material is silicon nitride.

13. The method according to claim 11, wherein removing the second sacrificial layer is a wet removal process.

14. The method according to claim 1, wherein forming the plurality of second trenches in the second transitional layer includes:
   forming a fourth patterned photoresist layer on the second transitional layer;
   etching the second transitional layer by using the fourth patterned photoresist layer and the second islands as a mask; and
   forming the plurality of second trenches.

15. The method according to claim 14, wherein after forming the plurality of second trenches, the method further includes:
   transferring the pattern of the plurality of first trenches into the etch layer and removing the pattern of second islands; and
   removing the second transitional layer.

16. The method according to claim 15, wherein removing the pattern of second islands and the second transitional layer includes a wet etching.

17. The method according to claim 1, wherein the etch layer has a structure with at least three layers.

18. The method according to claim 17, wherein when the etch layer is a three-layer structure, the etch layer includes a dielectric layer, a protective layer on the dielectric layer, and an etch-surface layer on the protective layer.

19. The method according to claim 1, wherein a pattern of the plurality of first trenches and the plurality of second trenches is transferred to the etch-surface layer, and a pattern of the etch-surface layer is transferred to the dielectric layer.

* * * * *